US012597937B2

(12) United States Patent
Fouzar et al.

(10) Patent No.: US 12,597,937 B2
(45) Date of Patent: Apr. 7, 2026

(54) REDUCE DCO FREQUENCY OVERLAP-INDUCED LIMIT CYCLE IN HYBRID AND DIGITAL PLLS

(71) Applicant: Microchip Technology Incorporated, Chandler, AZ (US)

(72) Inventors: Youcef Fouzar, Ottawa (CA); Waleed El-halwagy, Ottawa (CA); William Roberts, Highland, UT (US); Kristopher Kshonze, Ottawa (CA); Faizal Warsalee, Sittsville (CA)

(73) Assignee: Microchip Technology Incorporated, Chandler, AZ (US)

( * ) Notice: Subject to any disclaimer, the term of this patent is extended or adjusted under 35 U.S.C. 154(b) by 70 days.

(21) Appl. No.: 18/448,783

(22) Filed: Aug. 11, 2023

(65) Prior Publication Data

US 2024/0056087 A1 Feb. 15, 2024

Related U.S. Application Data

(60) Provisional application No. 63/371,105, filed on Aug. 11, 2022.

(51) Int. Cl.
 *H03L 7/099* (2006.01)
 *H03L 7/10* (2006.01)
(52) U.S. Cl.
 CPC ............ *H03L 7/0991* (2013.01); *H03L 7/104* (2013.01)
(58) Field of Classification Search
 CPC ...................................................... H03L 7/0991

USPC .......................................................... 375/376
See application file for complete search history.

(56) References Cited

U.S. PATENT DOCUMENTS

| | | |
|---|---|---|
| 2009/0309666 A1 | 12/2009 | Sun et al. |
| 2010/0039183 A1 | 2/2010 | Chen et al. |
| 2013/0027098 A1 | 1/2013 | Wang et al. |
| 2014/0091842 A1* | 4/2014 | Mehio ........................ H03L 7/18 327/147 |
| 2015/0263848 A1 | 9/2015 | Mobin et al. |
| 2015/0289154 A1* | 10/2015 | Pratt ........................ G01L 23/16 455/67.14 |
| 2022/0077864 A1 | 3/2022 | Kim et al. |
| 2023/0179208 A1 | 6/2023 | El-halwagy et al. |

FOREIGN PATENT DOCUMENTS

| | | |
|---|---|---|
| CN | 114142854 A | 3/2022 |

OTHER PUBLICATIONS

Chao, Pei-Ying et al., Process-Resilient Low-Jitter All-Digital PLL via Smooth Code-Jumping, IEEE Transactions on Very Large Scale Integration (VLSI) Systems, IEEE Service Center, vol. 21, No. 12, Dec. 1, 2023, pp. 2240-2249.
International Search Report of International Application No. PCT/US2023/072107, mailed Mar. 27, 2024, 8 pages.
(Continued)

*Primary Examiner* — Lihong Yu
(74) *Attorney, Agent, or Firm* — TraskBritt

(57) ABSTRACT

A method includes: observing that a digitally controlled oscillator (DCO) frequency is at a boundary of a DCO frequency overlap region; and bypassing at least a portion of the DCO frequency overlap region.

18 Claims, 12 Drawing Sheets

(56)            References Cited

OTHER PUBLICATIONS

Vo, Tuan Minh, A Non-Overlapping Frequency Aid Technique for
Fractional-N Digital Bang-Bang PLLs, 2019 IEEE Asia Pacific
Conference on Circuits and Systems (APCCAS), IEEE, Nov. 11,
2019, 4 pages.
Written Opinion of the International Searching Authority of Inter-
national Application No. PCT/US2023/072107, mailed Mar. 27,
2024, 17 pages.

* cited by examiner

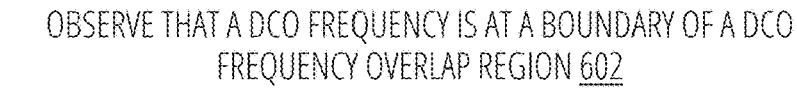
OBSERVE THAT A DCO FREQUENCY IS AT A BOUNDARY OF A DCO FREQUENCY OVERLAP REGION <u>602</u>
BYPASS AT LEAST A PORTION OF THE DCO FREQUENCY OVERLAP REGION <u>604</u>
FIG. 6

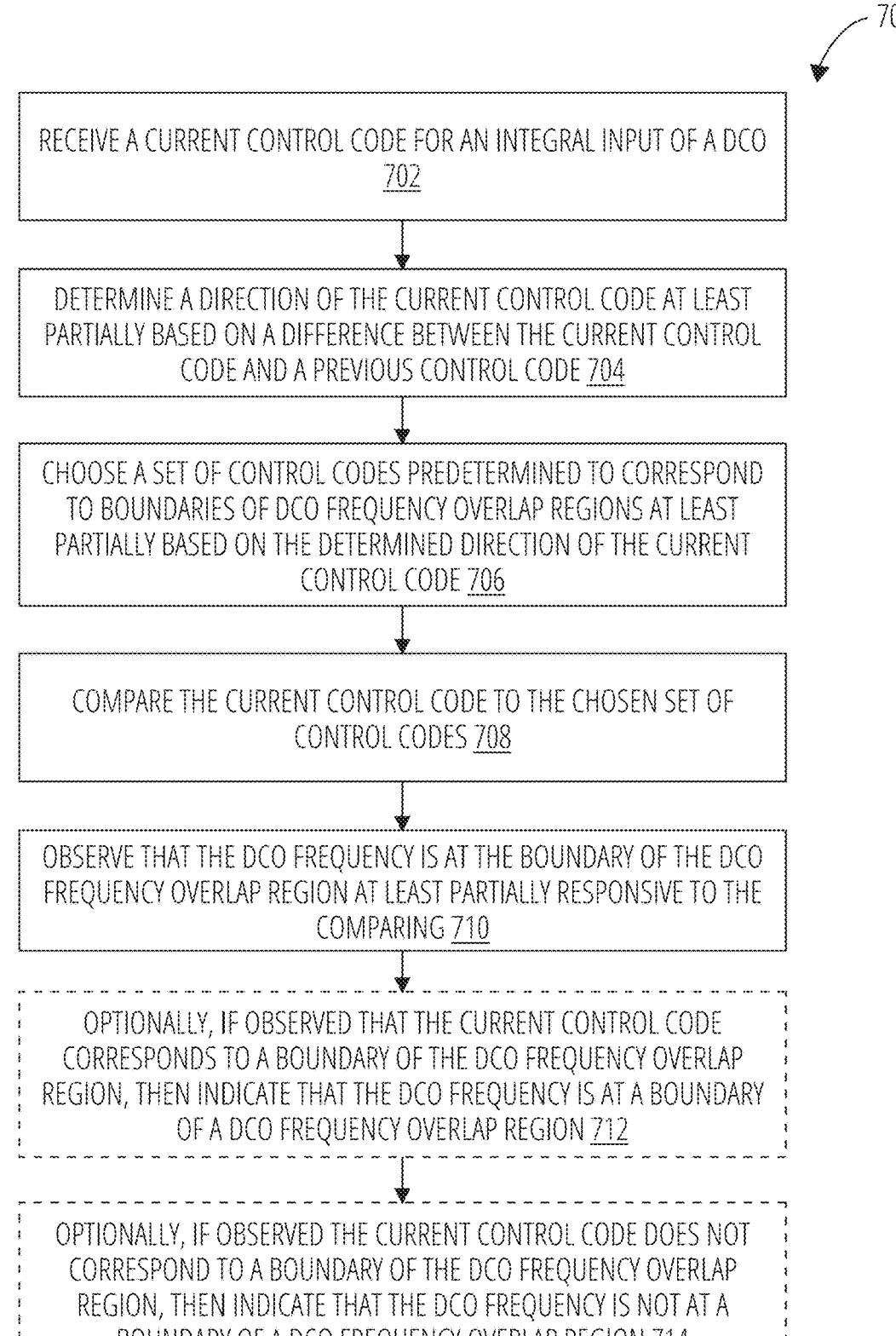

700

RECEIVE A CURRENT CONTROL CODE FOR AN INTEGRAL INPUT OF A DCO
702

DETERMINE A DIRECTION OF THE CURRENT CONTROL CODE AT LEAST
PARTIALLY BASED ON A DIFFERENCE BETWEEN THE CURRENT CONTROL
CODE AND A PREVIOUS CONTROL CODE 704

CHOOSE A SET OF CONTROL CODES PREDETERMINED TO CORRESPOND
TO BOUNDARIES OF DCO FREQUENCY OVERLAP REGIONS AT LEAST
PARTIALLY BASED ON THE DETERMINED DIRECTION OF THE CURRENT
CONTROL CODE 706

COMPARE THE CURRENT CONTROL CODE TO THE CHOSEN SET OF
CONTROL CODES 708

OBSERVE THAT THE DCO FREQUENCY IS AT THE BOUNDARY OF THE DCO
FREQUENCY OVERLAP REGION AT LEAST PARTIALLY RESPONSIVE TO THE
COMPARING 710

OPTIONALLY, IF OBSERVED THAT THE CURRENT CONTROL CODE
CORRESPONDS TO A BOUNDARY OF THE DCO FREQUENCY OVERLAP
REGION, THEN INDICATE THAT THE DCO FREQUENCY IS AT A BOUNDARY
OF A DCO FREQUENCY OVERLAP REGION 712

OPTIONALLY, IF OBSERVED THE CURRENT CONTROL CODE DOES NOT
CORRESPOND TO A BOUNDARY OF THE DCO FREQUENCY OVERLAP
REGION, THEN INDICATE THAT THE DCO FREQUENCY IS NOT AT A
BOUNDARY OF A DCO FREQUENCY OVERLAP REGION 714

FIG. 7

800
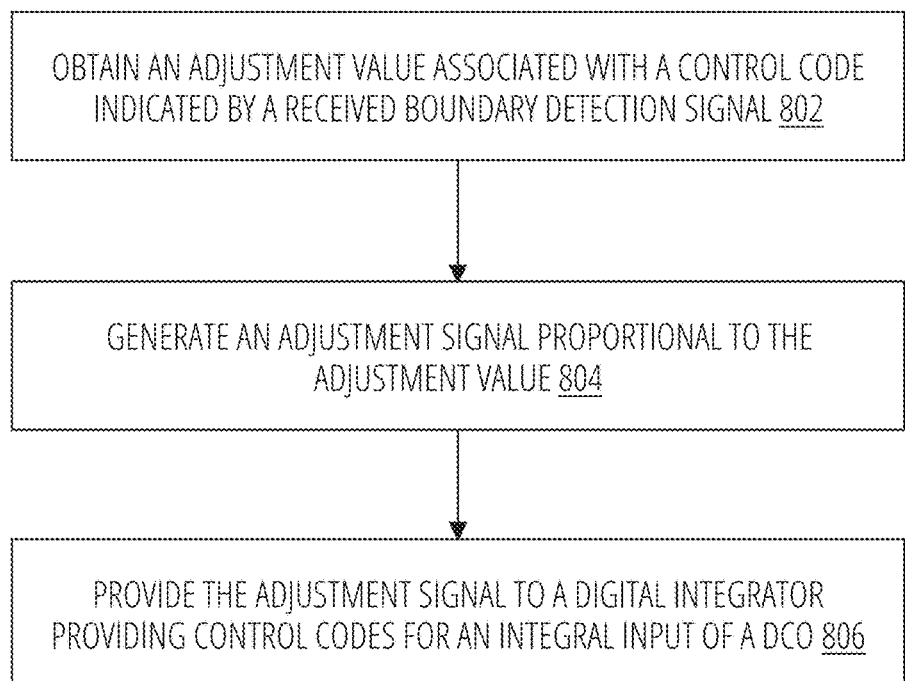
OBTAIN AN ADJUSTMENT VALUE ASSOCIATED WITH A CONTROL CODE INDICATED BY A RECEIVED BOUNDARY DETECTION SIGNAL 802
GENERATE AN ADJUSTMENT SIGNAL PROPORTIONAL TO THE ADJUSTMENT VALUE 804
PROVIDE THE ADJUSTMENT SIGNAL TO A DIGITAL INTEGRATOR PROVIDING CONTROL CODES FOR AN INTEGRAL INPUT OF A DCO 806
FIG. 8

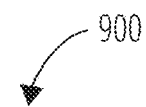
900
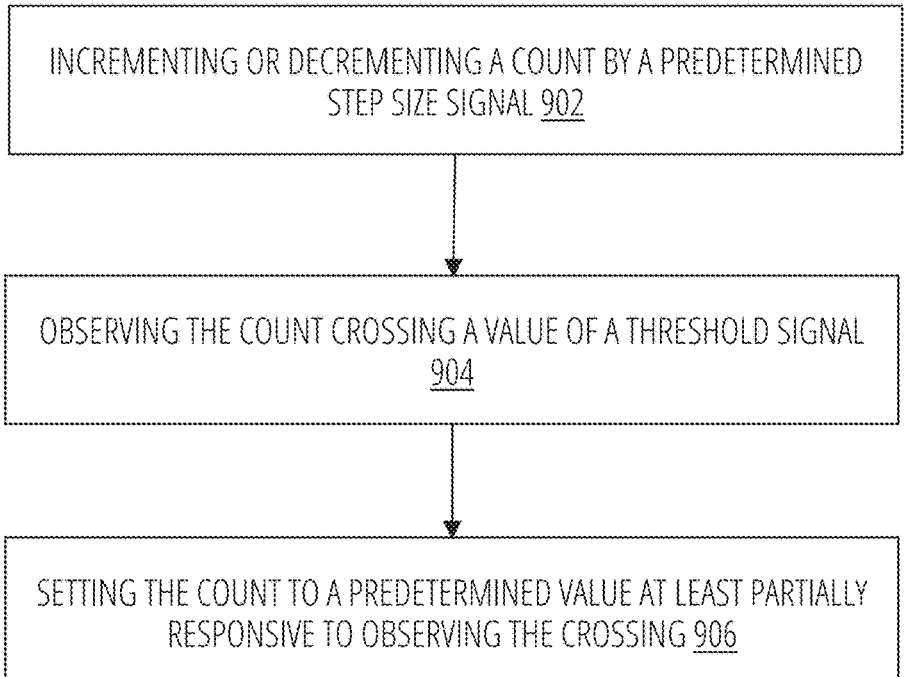
INCREMENTING OR DECREMENTING A COUNT BY A PREDETERMINED STEP SIZE SIGNAL 902
OBSERVING THE COUNT CROSSING A VALUE OF A THRESHOLD SIGNAL 904
SETTING THE COUNT TO A PREDETERMINED VALUE AT LEAST PARTIALLY RESPONSIVE TO OBSERVING THE CROSSING 906
FIG. 9

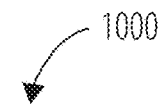
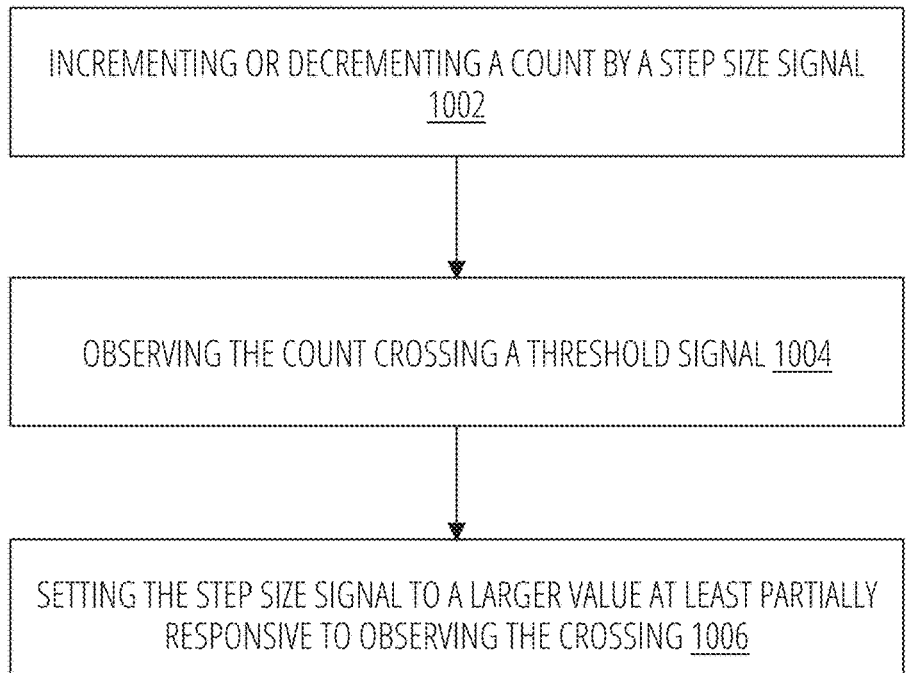
INCREMENTING OR DECREMENTING A COUNT BY A STEP SIZE SIGNAL 1002
OBSERVING THE COUNT CROSSING A THRESHOLD SIGNAL 1004
SETTING THE STEP SIZE SIGNAL TO A LARGER VALUE AT LEAST PARTIALLY RESPONSIVE TO OBSERVING THE CROSSING 1006
FIG. 10

REDUCE DCO FREQUENCY OVERLAP-INDUCED LIMIT CYCLE IN HYBRID AND DIGITAL PLLS

CROSS-REFERENCE TO RELATED APPLICATIONS

This application claims the benefit under 35 U.S.C. § 119(e) of the priority date of U.S. Provisional Patent Application Ser. No. 63/371,105, filed Aug. 11, 2022, for MITIGATE DCO OVERLAP INDUCED LIMIT CYCLE IN HYBRID AND DIGITAL PLLS, the contents and disclosure of which is incorporated herein in its entirety by this reference.

FIELD

One or more examples relate, generally, to clock tracking circuits for tracking an output clock to a reference clock. One or more examples relate to reducing undesirable effects of frequency redundancy in a digitally controlled oscillator of a clock track circuit.

BACKGROUND

Clock tracking circuits such as phase locked loops and delay locked loops, are circuits utilized to track clocks and other oscillating signals. An output signal of a clock tracking circuit is locked to the phase and frequency of a reference signal. Clock tracking circuits are utilized in a variety of operational contexts, including when two signals having known relationships are utilized to transmit information.

BRIEF DESCRIPTION OF THE DRAWINGS

To easily identify the discussion of any particular element or act, the most significant digit or digits in a reference number refer to the figure number in which that element is first introduced.

FIG. 6 is a flow diagram depicting a process to bypass DCO frequency overlap regions in a PLL, in accordance with one or more examples.

FIG. 7 is a flow diagram depicting a process to observe that a DCO frequency is at a boundary of a DCO frequency overlap region, in accordance with one or more examples.

FIG. 8 is a flow diagram depicting a process to bypass at least a portion of the DCO frequency overlap region, in accordance with one or more examples.

FIG. 9 is a flow diagram depicting a process to bypass at least a portion of the DCO frequency overlap region, in accordance with one or more examples.

FIG. 10 is a flow diagram depicting a process to bypass at least a portion of the DCO frequency overlap region, in accordance with one or more examples.

DETAILED DESCRIPTION

Figures 1A, 1B:
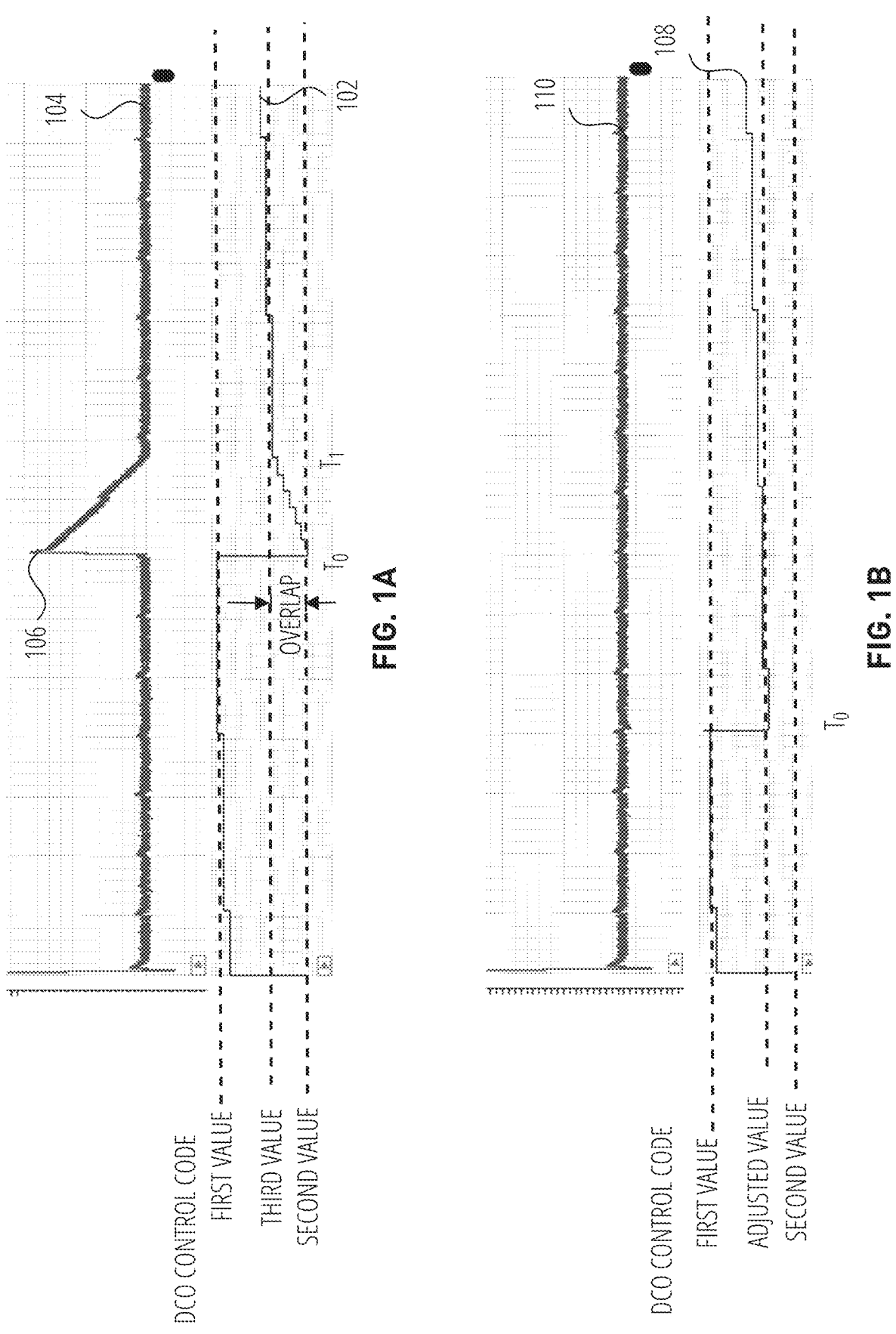
FIG. 1A is a graph depicting a line that represents a change in a DCO control code over time and a further line that represents a phase error signal generated by a PLL exhibiting a disturbance.
FIG. 1B is a graph depicting a line that represents a change in a DCO control code over time and a further line that represents a phase error signal generated by a PLL exhibiting less or no disturbance (as compared to FIG. 1A), in accordance with one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner.

In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," without limitation, is used for clarity and convenience in understanding the disclosure and accompanying drawings and does not connote or depend on any specific preference, orientation, or order, except where the context clearly indicates otherwise.

In this description, the term "coupled," and derivatives thereof, may be used to indicate that two elements cooperate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

A clock signal or just a "clock," is a signal that oscillates between a high state and a low state in a reliably predictable manner. A circuit may operate responsive to edges of a clock to coordinate its actions.

A phase locked loop (PLL) generates an output signal exhibiting a phase or frequency having a predetermined relationship to a phase or frequency of a reference signal. Causing and maintaining such a predetermined relationship between the phase or frequency of an output signal and a reference signal is referred to herein as "tracking." The predetermined relationship may be that the frequency of the output signal is the same as, or a multiple of, a frequency of the reference signal. As a non-limiting example, the frequency of the output signal may be $\frac{1}{200}$, $\frac{1}{10}$, 10, or 200 times the frequency of the reference signal. When a PLL reliably tracks an output signal to a reference signal, that is referred to as "locked" or being in a "locked state." When locked, if the phase or frequency of a reference signal changes, a PLL correspondingly adjusts the phase or frequency of the output signal to maintain the predetermined relationship.

A typical PLL includes an electronic oscillator that the PLL controls to generate an output signal that tracks a reference signal. An electronic oscillator may include one or more banks of control elements (e.g., capacitors, inductors, delay circuits, without limitation) that are voltage controlled, current controlled, digitally controlled, or a combination or sub-combination thereof. Enabling and disabling respective control elements changes the capacitance, inductance, or delay, as the case may be, of the electronic oscillator in a predictable manner, which changes the output frequency of the electronic oscillator in a predictable manner. As a non-limiting example, increasing capacitance, inductance, or delay of an electronic oscillator decreases its output frequency. Decreasing capacitance, inductance, or delay of an electronic oscillator increases its output frequency.

An electronic oscillator may include multiple inputs for controlling (enabling/disabling) various banks of control elements and, accordingly, governing the phase and frequency of an output signal. Non-limiting examples of electronic oscillators include a voltage controlled oscillator (VCO) that generates an output signal exhibiting a phase or frequency governed by a voltage of a control signal, a current controlled oscillator (CCO) that generates an output signal exhibiting a phase or frequency governed by a current of a control signal, a digitally controlled oscillator (DCO) that generates an output signal exhibiting a phase or frequency governed, at least in part, by a value of a control code, and combinations/sub-combinations thereof.

A PLL may include one or more control paths to control the electronic oscillator via one or more control inputs of the electronic oscillator. Non-limiting examples of control paths include a proportional control path for transient correction of phase differences between a feedback signal and a reference signal, and an integral control path to urge an average frequency of the electronic oscillator toward a target frequency. Such control paths may include analog circuits, digital circuits, or combinations thereof. A PLL that includes only analog control paths is referred to as an "analog PLL." A PLL that includes only digital control paths is referred to as a "digital PLL." A PLL that includes a combination of analog and digital control paths is sometimes referred to as a "hybrid PLL" or "mixed-mode PLL."

Digital and hybrid PLLs utilize digital control codes to govern the output signal of the PLL when utilizing a DCO. A control code sets, via a digital control input (or just "digital input") of the DCO, the number of control elements in the DCO, so setting the value of a control code sets the number of control elements at the DCO and, thus, sets the frequency of the DCO ("DCO frequency"). A typical convention is to configure the PLL such that increasing the value of a control code increases the DCO frequency (i.e., increasing the value of a control code decreasing the number of control elements that are set, which increases the DCO frequency), and decreasing the value of a control code decreases a DCO frequency (i.e., by increasing the number of control elements that are set, which decreases the DCO frequency). Other conventions may be utilized without exceeding the scope of this disclosure.

In a digital PLL, certain values of control codes are associated with specific frequency sub-ranges of the DCO. Generally speaking, a DCO should provide continuous frequency in a predefined frequency range. Discontinuities (also called "gaps") in a frequency range of the DCO causes jitter, which is generally undesirable. Discontinuities are specific frequencies or sub-ranges within the predefined frequency range of the DCO that are skipped as the value of the control code is monotonically increased or decreased. Gaps can occur in the frequency range, for example, due to process-voltage-temperature (PVT) variations and mismatch that occurs during fabrication of a DCO or PLL more generally.

Frequency redundancy is sometimes implemented at a DCO to ensure continuity of frequency range. The DCO is intentionally configured to exhibit overlapping frequency sub-ranges (each such overlap referred to herein as a "DCO frequency overlap region") for ranges of values of the control code to ensure continuous frequency coverage (i.e., no frequency gaps) even when exposed to PVT variations. Frequency overlap entails overlapping portions of frequency sub-ranges for DCO codes.

During operation, when the PLL increases or decreases control code from one set of values to another set of values, representing a first frequency sub-range to a second frequency sub-range, the DCO frequency backtracks and retraces the portion of the DCO frequency range for the set of values that corresponds to the DCO frequency overlap region. Crossing a DCO frequency overlap region can disturb the phase error of a PLL and the disturbance may be exhibited as a limit cycle in the control code. In the context of a PLL, a limit cycle is a recurring pattern or oscillation in the behavior of the PLL control code or state variable that occurs when the PLL is unable to reach a steady state and instead settles into a periodic or repetitive behavior. Limit cycles degrade jitter performance. Thus, frequency redundancy may bring the trade-off of degraded jitter performance.

When crossing a DCO frequency overlap region, the DCO frequency backtracks and then resumes increasing or decreasing with the monotonically increasing or decreasing control code. The DCO frequency retraces a portion of a previous DCO frequency sub-range, and that portion represents the DCO frequency overlap region between the previous DCO frequency sub-range and the current DCO frequency sub-range. Reducing the amount of DCO frequency overlap region experienced by the PLL reduces the limit cycles due to the DCO frequency backtracking. The amount of DCO frequency overlap region is reduced by increasing or decreasing the value of the control code by an adjustment amount thereby skipping some or a totality of values of the control code associated with the DCO frequency overlap region, while still avoiding gaps in the DCO frequency range.

One or more examples relate, generally, to reducing limit cycles due to DCO frequency overlap region in a clock tracking circuit, and methods and apparatuses that include the same.

One or more examples relate, generally, to a method that includes: detecting a boundary of a DCO overlap has been reached, determining a direction of an integral control path, determining an amount of DCO overlap at the detected boundary, and adjusting an integral control signal, at least temporarily, at least partially based on the determined amount of DCO overlap at the detected boundary.

FIG. 1A is a graph depicting a line that represents a change in a DCO control code over time and a further line that represents phase error signal generated by a PLL having an output signal is at least partially governed by the DCO control codes. The phase error signal generated by the PLL exhibits a disturbance as discussed below.

Line 102 represents a relationship between values of DCO control codes and time (or DCO control codes over a duration of time). The y-axis is values of DCO control codes increasing from bottom of the axis toward the top of the axis. The x-axis is time, increasing from left to right.

Line 104 represents a phase error signal generated by a PLL having an output signal that is at least partially governed by the DCO control codes represented by line 102. The y-axis is an amount of delay (with one of the positive or negative signs representing a leading delay and the other of the positive or negative sign representing a lagging delay). The x-axis is time, increasing from left to right.

At about time $T_0$, line 102 exhibits a change from first value to a second value and then, after time $T_0$, line 102 increases stepwise over a time duration from time $T_0$ to $T_1$ from the second value to a third value and then beyond. The third value lies between the first value and the second value. The range of DCO control codes between the second value and the third value corresponds to a DCO frequency overlap region for a DCO controlled by these DCO control codes.

Before time $T_0$, line 104 is generally horizontal, representing a generally stable phase error. At about time $T_0$, line 104 exhibits a disturbance 106: a dislocation to a higher phase error (i.e., a greater delay) and then line 104 decreases the time duration from time $T_0$ to $T_1$ to the same phase error prior to time $T_0$. The disturbance 106 corresponds to a DCO frequency overlap region, which corresponds to the range of values between the second value and the third value.

FIG. 1B is a graph depicting a line that represents a change in a DCO control codes over time and a further line that represents a phase error signal generated by a PLL having an output signal is at least partially governed by the DCO control codes, in accordance with one or more examples. The phase error signal depicted by FIG. 1B exhibits less (as compared to the phase error signal depicted by FIG. 1A) or no disturbance.

Line 108 represents a relationship between DCO control code values and time (or DCO control code values over a duration of time). The y-axis is values of DCO control codes increasing from bottom of the axis toward the top of the axis. The x-axis is time, increasing from left to right.

Line 110 represents a phase error signal generated by a PLL having an output signal that is at least partially governed by the DCO control codes represented by line 108. The y-axis is an amount of delay (with one of the positive or negative sign representing a leading delay and the other of the positive or negative sign representing a lagging delay). The x-axis is time, increasing from left to right.

At about time $T_0$ line 108 exhibits a change from a first value to an adjusted value (also referred to herein as a "changed value") and then after time $T_0$ line 108 increases from the adjusted value. Also depicted (as a convenient reference) is a second value, which corresponds to the second value in FIG. 1A. Adjusted value is between first value and second value. Notably, line 108 never exhibits second value. At time $T_o$, line 108 changes from first value to adjusted value, and does not ever equal the range of values corresponding to a DCO frequency overlap region, i.e., second value≤DCO control code<adjusted value. Thus, line 110, the phase error signal, does not exhibit a disturbance (e.g., a disturbance 106) due to DCO frequency overlap as compared to line 104 of FIG. 1A.

Figure 2:
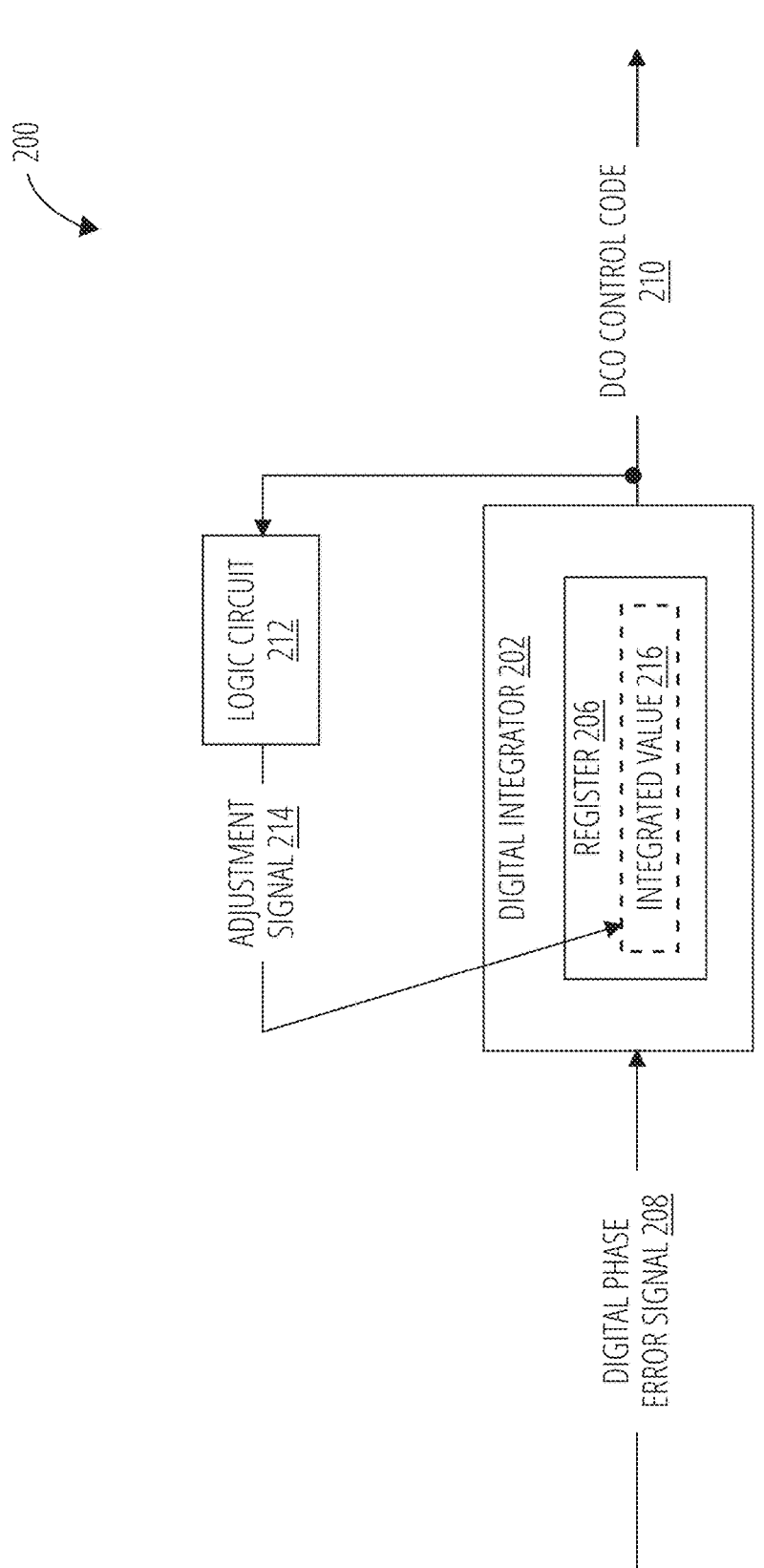
FIG. 2 is a block diagram depicting an integral path portion for bypassing DCO frequency overlap regions in a PLL, in accordance with one or more examples.

FIG. 2 is a block diagram depicting an integral path portion 200 for bypassing DCO frequency overlap regions in a PLL, in accordance with one or more examples.

Integral path portion 200 includes a digital integrator 202 and a logic circuit 212. The digital integrator 202 includes a register 206.

Integral path portion 200 is a portion of an integral control path of a PLL. Integral path portion 200 processes digital phase error signals to produce frequency error signals. More specifically, integral path portion 200 integrates frequency information and filters out rapid phase error information. Hence, a change in a frequency error signal produced by integral path portion 200 is slower compared to a change in an error signal utilized for proportional control of the PLL, which responds faster to any phase error but detects little or no frequency information from the error signal. A frequency error signal produced by integral path portion 200 may be utilized as a DCO control code (here, DCO control code 210) that may be applied to an integral input of a DCO of the PLL. Thus, a frequency error signal/DCO control code produced by integral path portion 200 represents the PLL's attempt to correct any gradual drift in frequency.

Digital integrator 202 receives digital phase error signal 208 and generates DCO control code 210. Digital integrator 202 may be, as a non-limiting example, a digital signal processor (DSP) or other logic circuit. Digital phase error signal 208 is a binary representation of a phase error signal that represents the difference in phase between two clock signals. DCO control code 210 represents the frequency error information (i.e., a frequency error signal) of digital phase error signal 208.

Digital integrator 202 accumulates a digital input signal (e.g., a discrete-time signal or discrete samples of a continuous-time signal, without limitation) over time and generates an output signal that corresponds to the integrated value 216, which is stored at register 206. When the digital input signal is digital phase error signal 208, the integrated value 216 represents the frequency error information in digital phase error signal 208. As discussed above, in a digital PLL, the bits (i.e., the register bits) of the integrated value 216 may be utilized as a control code provided to an integral input of a DCO. So, the bits of the integrated value 216 may be utilized to control (i.e., set) DCO frequency.

Since DCO control code 210 may be utilized to set DCO frequency and DCO control code 210 is based on bits of integrated value 216, integrated value 216 may be set to bypass at least a portion of a DCO frequency overlap region. As a non-limiting example, absent external influences, integrated value 216 monotonically increases or decreases according to whether the PLL is increasing or decreasing the DCO frequency. When DCO control code 210 matches a DCO control code value associated with a boundary of a DCO frequency overlap region, integrated value 216 may be set—e.g., increased, decreased, or directly set to a new value, as the case may be—by some amount (an "adjustment amount") to bypass (or characterized another way, "to jump") at least some (i.e., some or a totality) of those DCO control code value(s) associated with the DCO frequency overlap region. DCO control code value(s) associated with a DCO frequency overlap region is a value or range of values of DCO control code 210 that corresponds to a DCO frequency overlap region. Bypassing at least some of those DCO control code values may, as a non-limiting example, reduce limit cycles and jitter associated therewith.

Logic circuit 212 receives DCO control code 210 and generates adjustment signal 214 to set the integrated value 216 stored at register 206 of digital integrator 202. Logic circuit 212 may be, as a non-limiting example, a digital logic circuit. Adjustment signal 214 is a signal utilized by integral path portion 200, and more specifically logic circuit 212, to set integrated value 216. Adjustment signal 214 may represent, as non-limiting examples, an amount by which to increase or decrease integrated value 216 or a new value that integrated value 216 is to be set equal to. An amount of increase or decrease in integrated value 216 caused by adjustment signal 214 is proportional to the value/magnitude of adjustment signal 214.

In one or more examples, logic circuit 212 generates adjustment signal 214 at least partially responsive to observing that a value of DCO control code 210 is associated with a boundary of a DCO frequency overlap region. As a non-limiting example, the value of a DCO control code 210 may correspond to a frequency that is at or near a boundary of a DCO frequency overlap region. In one or more examples, values of DCO control codes associated with boundaries of DCO frequency overlap region may be predetermined and stored at logic circuit 212. Upon observing that a DCO control code 210 corresponds to a boundary, logic circuit 212 determines a new value for integrated value 216 or an amount by which the integrated value 216 stored at register 206 should be increased or decreased to bypass the DCO frequency overlap region (an "adjustment amount") and generates adjustment signal 214 that is proportional to the determined adjustment amount. In one or more examples, logic circuit 212 may determine a new value by determining an adjustment amount and adding or subtracting it to or from a current value of DCO control code 210. In one or more examples, predetermined adjustment amounts or new values may be stored at logic circuit 212 and utilized by logic circuit 212.

Any suitable technique may be utilized to set the integrated value 216 stored at register 206 via adjustment signal 214. In one or more examples, a gain of digital integrator 202 may be a variable gain expressed according to a gain function. Such a gain function may be at least partially based on one or more gain defining parameters of digital integrator 202. In one or more examples, adjustment signal 214 may change the gain of digital integrator 202, which affects integrated value 216 stored at register 206. By changing the gain, the integration process may be controlled allowing for adjustments to integrated value 216.

The gain of digital integrator 202 may be set via one or more gain-defining parameters of digital integrator 202. Specific gain-defining parameters will depend on the specific implementation of digital integrator 202. Non-limiting examples include: an accumulator register that sums up phase error or phase error samples over time; or a numerical integration algorithm for discrete-time calculation to calculate an integral value and update integrated value 216 accordingly.

In the case of an accumulation register, non-limiting examples of gain-defining parameters include: an accumulation step size, an accumulation time, or a gain factor applied to an accumulator output. Accumulation step size is the step size or increment value used in an accumulation register to determine how much each input value contributes to an accumulated value (accumulated value corresponds to integrated value 216) stored at the accumulation register. Adjusting the step size controls the gain of digital integrator 202. Increasing the step size increases the gain of digital integrator 202 (results in a higher gain) and decreasing the step size decreases the gain of digital integrator 202 (results in a lower gain). Accumulation time is the rate at which the accumulated value stored at register 206 is updated (the "update rate"), which affects the gain of digital integrator 202. As a non-limiting example, accumulation time may be controlled, as a non-limiting example, via a rate of a clock signal applied to digital integrator 202. Changing the time interval between updates controls the effective gain of digital integrator 202. Increasing the update rate increases the effective gain of digital integrator 202 (results in higher gain) and decreasing the update rate decreases the effective gain of digital integrator 202 (results in lower gain). A scaling factor is a function or value applied to values provided to, or received from, an accumulation register. Such a scaling factor may be a fixed value or dynamically adjusted. A scaling factor multiplies or divides an accumulated value, effectively controlling the gain of digital integrator 202.

Register 206 receives and stores integrated value 216, and DCO control code 210 is based on at least some of the bits of register 206 utilized to represent accumulated integrated value 216. For a given number of register bits N of register 206, $2^N$ steps may be applied to an input of a DCO for integral control of the DCO frequency. Respective steps correspond to incremental changes in DCO frequency.

Figure 3:
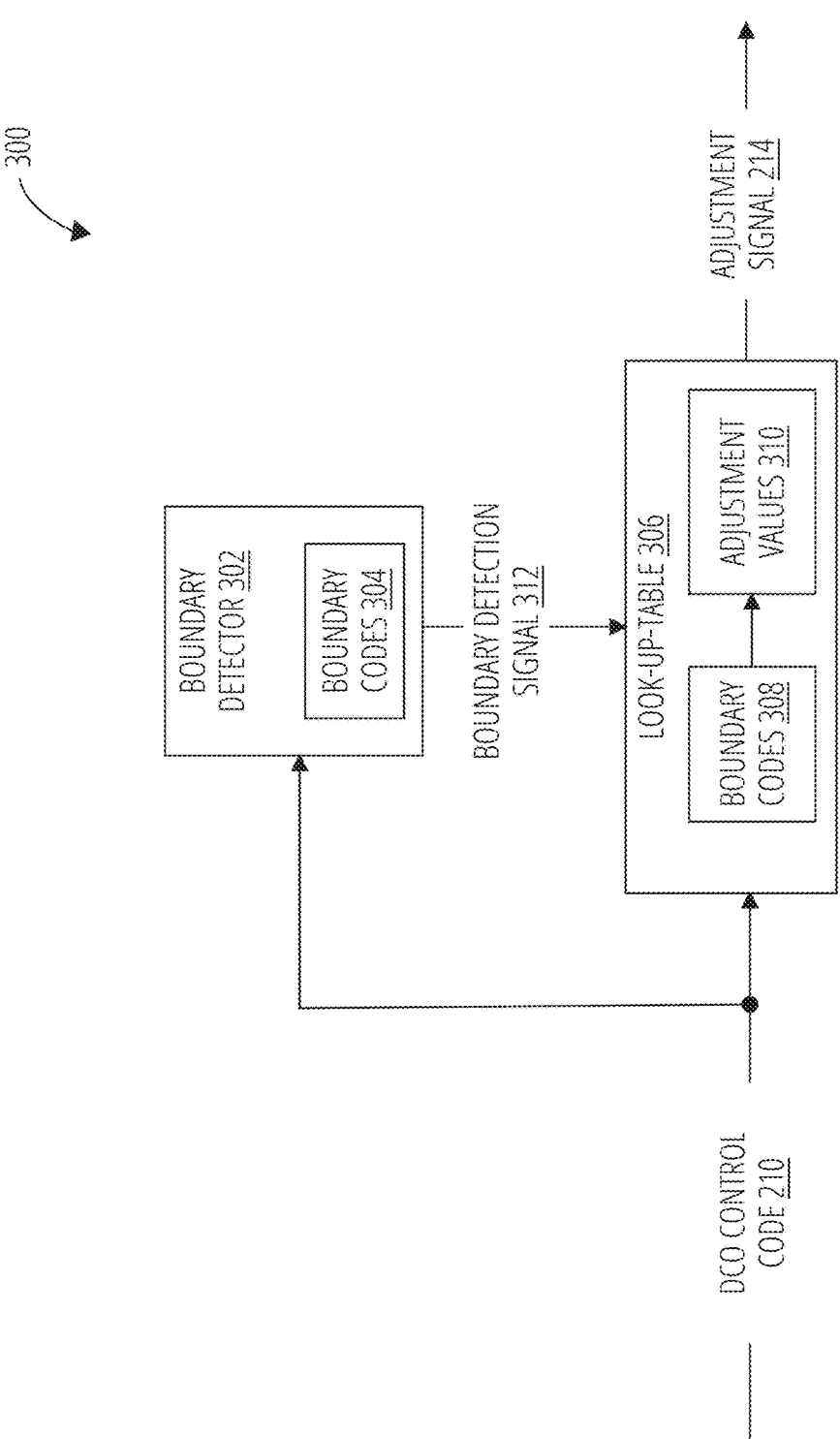
FIG. 3 is a block diagram depicting an apparatus for generating an adjustment signal, in accordance with one or more examples.

FIG. 3 is a block diagram depicting an apparatus 300 to generate an adjustment signal, in accordance with one or more examples. Apparatus 300 is a non-limiting example of logic circuit 212 of FIG. 2.

Apparatus 300 includes boundary detector 302 and Look-Up-Table 306 (or "LUT 306"). Look-Up-Table 306 includes boundary codes 308 and adjustment values 310. Boundary detector 302 includes boundary codes 304.

Boundary detector 302 detects the presence of one or more signals-of-interest (here, boundary codes 304) within an input signal (here, DCO control code 210) and generates a detector output (here, boundary detection signal 312) to indicate presence or absence of the one or more signals-of-interest. Boundary detector 302 receives DCO control codes 210 and generates boundary detection signal 312 to indicate detection of the presence of boundary codes 304 in DCO control code 210. Boundary detector 302 may be, as a non-limiting example, a logic circuit that signal detects or pattern matches. Boundary codes 304 represents values of DCO control codes predetermined to be associated with frequencies that define upper boundary and lower boundary of the range of frequencies in DCO frequency overlap regions.

Boundary detector 302 compares values of DCO control code 210 to boundary codes 304 and generates boundary detection signal 312 at least partially responsive to the comparison. boundary detection signal 312 indicates whether or not a boundary of a DCO frequency overlap region has been detected. In one or more examples, boundary detector 302 generates boundary detection signal 312 having a first value responsive to determining that a DCO control code 210 matches one of the boundary codes 304, and generates boundary detection signal 312 having a second, different, value responsive to determining that none of the boundary codes 304 match DCO control code 210.

In one or more examples, the specific boundary codes 304 boundary detector 302 detects is at least partially based on a state of the DCO frequency (increasing or decreasing). Boundary detector 302 may detect the presence of a first subset of boundary codes 304 when DCO frequency is increasing, and detect the presence of a second, different, subset of boundary codes 304 when DCO frequency is decreasing. In one or more examples, boundary detector 302 may use any suitable technique to detect the state of DCO frequency (increasing or decreasing).

In one or mor examples, boundary detector 302 may infer increasing DCO frequency in response to an increasing DCO control code 210 and infer decreasing DCO frequency in response to a decreasing DCO control code 210. In one or more examples, boundary detector 302 may use any suitable technique to determine whether or not DCO control code 210 is increasing or decreasing.

As a non-limiting example, boundary detector 302 may monitor an average change in digital phase error signal 208 and determine direction information at least partially based on the average change. Additionally or alternatively, boundary detector 302 may monitor an average change in value of DCO control codes and determine direction information at least partially based on the average change.

As another non-limiting example, boundary detector 302 may determine increasing DCO frequency or decreasing DCO frequency based on directional information in digital phase error signal 208 (receipt of digital phase error signal 208 is not shown in FIG. 3 and should be understood to be optional). If digital phase error signal 208 is generated by a bang-bang-phase-detector the increment and decrement signals generated by the bang-bang-phase-detector may be decoded to determine directional information about digital phase error signal 208 and, therefore, DCO frequency. As a non-limiting example, if digital integrator 202 is, on average, incrementing more (e.g., incrementing integrated value 216 and therefore DCO control code 210) then boundary detector 302 should detect when DCO control code 210 is approaching a value corresponding to an upper boundary of a DCO frequency overlap region. If digital integrator 202 is, on average, decrementing more (e.g., decrementing integrated value 216 and therefore DCO control code 210) then boundary detector 302 should detect when DCO control code 210 is approaching a value corresponding to a lower boundary of a DCO frequency overlap region.

In one or more examples, boundary detector 302 may keep (e.g., store in a memory, without limitation) historical DCO control codes and based on a difference between a previous DCO control code and a current DCO control code determine that DCO control codes are increasing or decreasing.

Look-Up-Table 306 associates input values (here, values of DCO control code 210) with output values (here, adjustment values 310). In one or more examples, Look-Up-Table 306 maps input values by utilizing input values (or values derived from the input values) as addresses associated with locations in a memory or memory array of Look-Up-Table 306 (memory not depicted) storing the output values. Look-Up-Table 306 retrieves output values from memory utilizing the input values as addresses.

Look-Up-Table 306 receives DCO control code 210 at an input and boundary detection signal 312 at an enable input and provides adjustment signal 214 at least partially responsive thereto. A direct mapping between boundary codes 308 and adjustment values 310 is provided at Look-Up-Table 306. When boundary detection signal 312 is asserted, Look-Up-Tables 306 is enabled and attempts to retrieve an adjustment value associated with DCO control code 210.

Adjustment values 310 represent amounts by which to increase or decrease integrated value 216 or a new value that integrated value 216 is to be set equal to in order to bypass DCO control code values predetermined to correspond to a DCO frequency overlap region. Respective adjustment values 310 may be predetermined. As a non-limiting example, adjustment values 310 may be predetermined and stored during calibration of a DCO or PLL.

In one or more examples, stored adjustment values 310 may be signed (positive or negative) and so adjustment signal 214 may be signed (positive or negative). Respective adjustment values 310 and adjustment signal 214 are signed to represent whether an offset represented by adjustment values 310 or adjustment signal 214 is to be applied from the bottom of a range or a top of a range of DCO code values associated with a DCO frequency overlap region in order to bypass DCO control corresponds that correspond to a DCO frequency overlap region. When approaching an upper boundary code, the offset amount is applied from the bottom of the range and so has a positive sign. When approaching a lower boundary code, the offset amount is applied from the top of the range and so has a negative sign.

Figure 4:
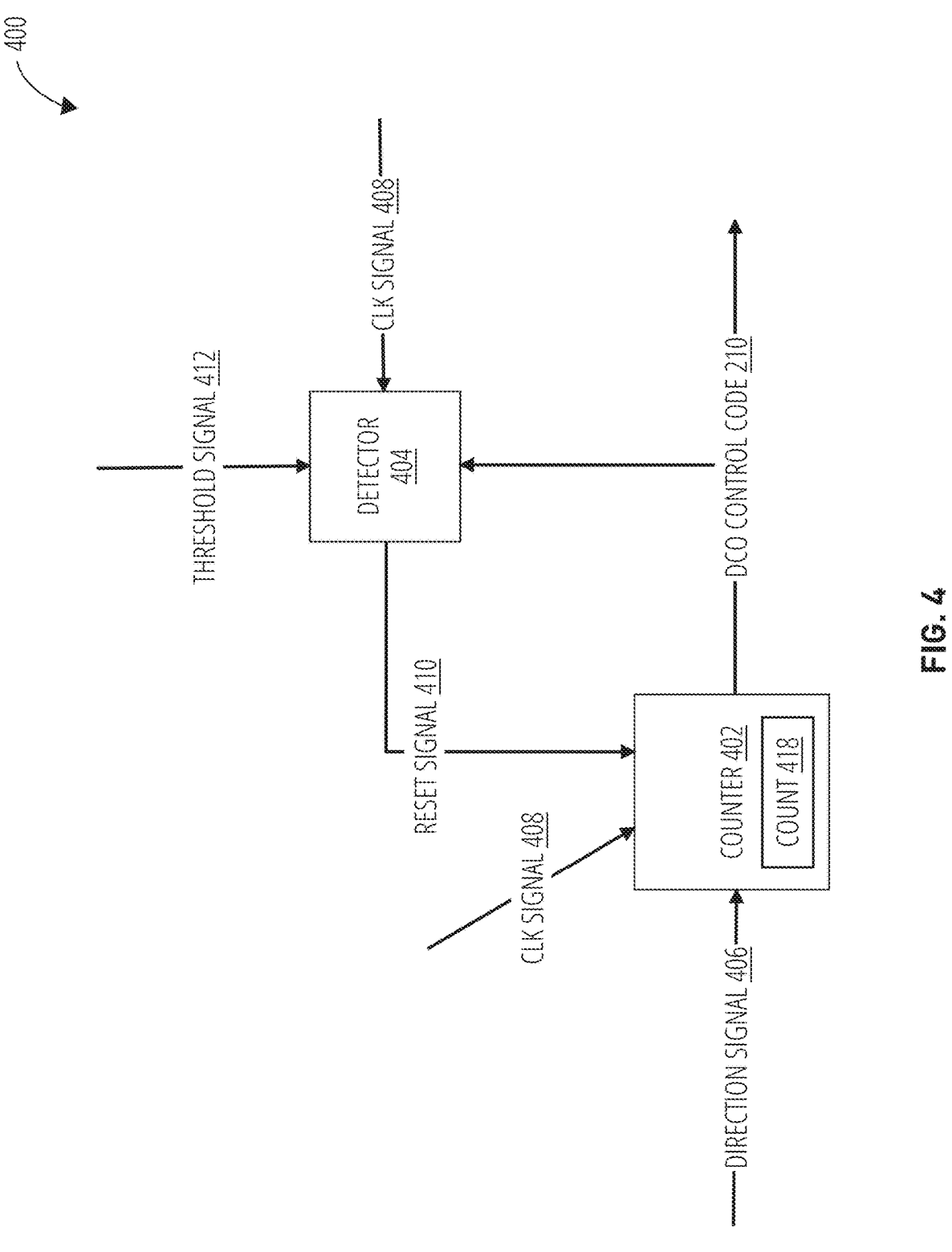
FIG. 4 is a block diagram depicting an apparatus for bypassing DCO control codes corresponding to a DCO frequency overlap region, in accordance with one or more examples.

FIG. 4 is a block diagram depicting an apparatus 400 for bypassing DCO control codes corresponding to a DCO frequency overlap region, in accordance with one or more examples. Apparatus 400 includes a counter 402 and a detector 404. Apparatus 400 is a non-limiting example of an integral path portion 200.

Counter 402 receives direction signal 406, clock signal 408 (clk signal 408), and reset signal 410. Direction signal 406 indicates whether DCO control codes are increasing or decreasing. Any suitable technique may be utilized to determine a direction information indicated by direction signal 406, such as utilizing average change in value of phase error signal or DCO control code, without limitation. In one or more examples, direction signal 406 may be generated by a further logic circuit that is external to counter 402, or by a logic circuit of counter 402 (e.g., counter 402 is count logic circuit that receives signals indicative of phase error or DCO control code and determine direction information based thereon).

Clk signal 408 may be a local clock, system clock, a reference clock of a PLL, a feedback clock of a PLL, or derived from any of the foregoing (e.g., a frequency divided version, without limitation), without limitation.

In one or more examples, counter 402 operates as follows: if direction signal 406 indicates that digital phase error signal 208 is decreasing than counter 402 decrements a value of a count 418 by a predetermined amount each clock cycle. If direction signal indicates digital phase error signal 208 is increasing than counter 402 increments a value of count 418 by a predetermined amount each clock cycle.

Counter 402 resets a value of count 418 in response to an assertion of reset signal 410. In response to reset signal 410 being asserted and direction signal 406 indicates that digital phase error signal 208 is decreasing, counter 402 resets the value of count 418 to the top of the DCO control codes range minus a predetermined adjustment amount to bypass values that correspond to the DCO frequency overlap region. In response to reset signal 410 being asserted and direction signal 406 indicates that digital phase error signal 208 is increasing, counter 402 resets the value of count 418 to the bottom of the DCO control code range plus a predetermined adjustment amount to bypass values that correspond to the DCO frequency overlap region. DCO control code 210 may be based at least partially on count 418.

Detector 404 (which may also be referred to herein as a "threshold detector 404") detects when count 418 crosses a value of threshold signal 412. The value of threshold signal 412 may change or be set by a circuit that is not shown. When the value of count 418 is increasing (and so DCO control codes are increasing) detector 404 detects a crossing from below to above the value of threshold signal 412. When the value of count 418 is decreasing (and so DCO control codes are decreasing) detector 404 detects a crossing from above to below the value of threshold signal 412. Detector 404 asserts reset signal 410 at least partially in response to detecting a crossing of the value of threshold signal 412.

In this example, the adjustment signal 214 is the reset signal 410 responsive to which counter 402 sets count 418 equal to reset values.

Figure 5:
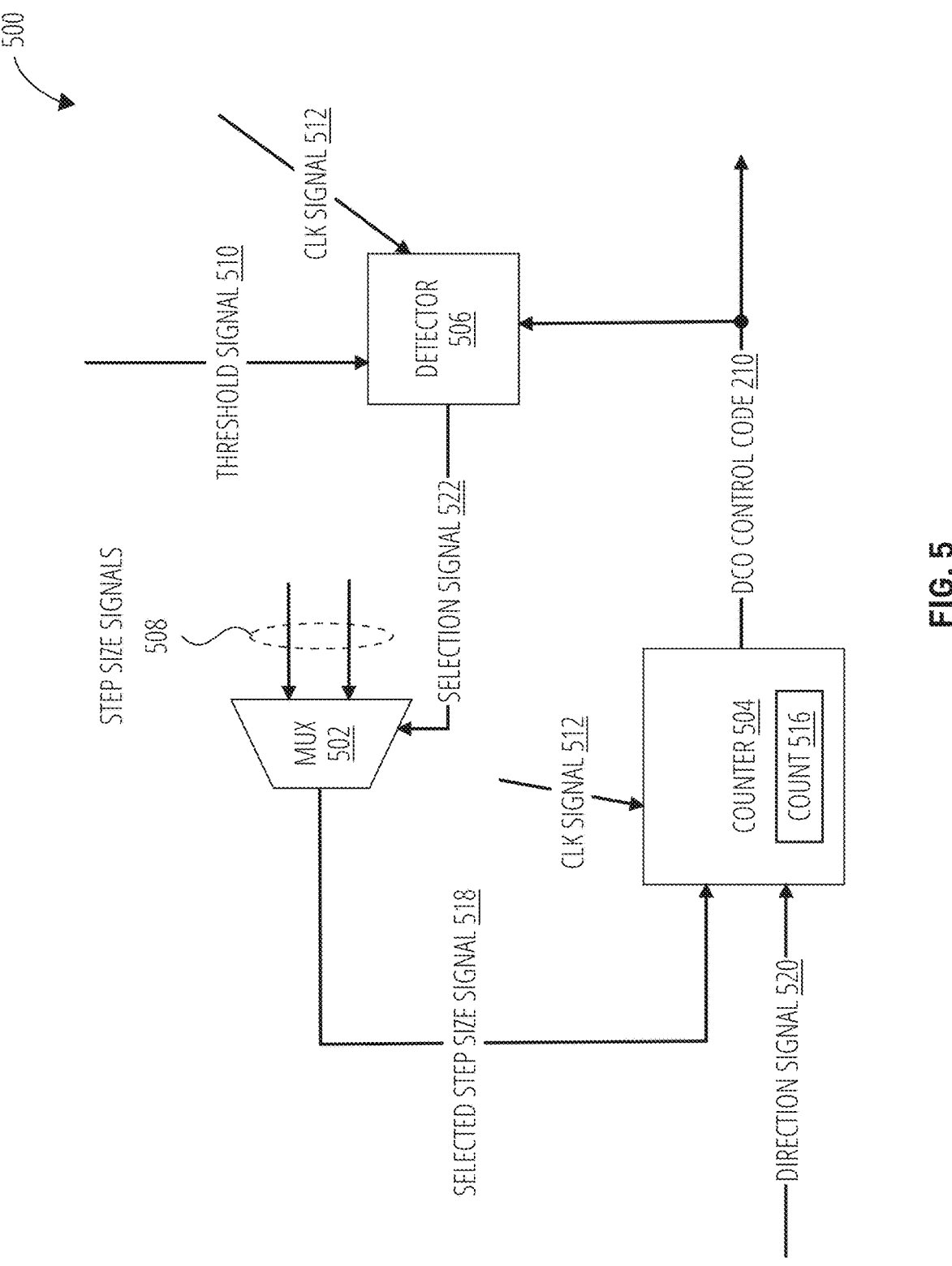
FIG. 5 is a block diagram depicting an apparatus bypassing DCO control codes corresponding to a DCO frequency overlap region, in accordance with one or more examples.

FIG. 5 is a block diagram depicting an apparatus 500 for bypassing DCO control codes corresponding to a DCO frequency overlap region, in accordance with one or more examples. Apparatus 500 is a non-limiting example of an integral path portion 200.

Apparatus 500 includes a counter 504, detector 506, and multiplexer 502. Multiplexer 502 selects one of step size signals 508 to be the selected step size signal 518 in response to a selection signal 522 generated by detector 506. Step size signals 508 include at least two step sizes that represent different amounts.

Counter 504 receives selected step size signal 518 output by multiplexer 502, direction signal 520, clock signal 512 (clk signal 512). The value of selected step size signal 518 represents an amount by which counter 504 increments or decrements a value of count 516 each clock cycle. Direction signal 520 indicates whether counter 504 increments or decrements a value of count 516 each clock cycle. Any suitable technique may be utilized to determine the direction information indicated by direction signal 520. As a non-limiting example, direction information indicated by direction signal 520 may be determined based on an average change in value of a phase error-signal. Direction signal 520 may be generated by a further logic circuit that is external to counter 504, or by a logic circuit of counter 504 (e.g., counter 504 is count logic circuit that receives signals indicative of phase error and determines direction information based thereon).

In one or more examples, counter 504 operates as follows: if direction signal 520 indicates that the value of count 516 is decreasing (and so if DCO control codes are decreasing), then counter 504 decrements a value of count 516 by selected step size signal 518 each clock cycle. If direction signal 520 (and so if DCO control codes are increasing) indicates a value of count 516 are increasing (and so if DCO control codes are increasing), than counter 504 increments a value of count 516 by selected step size signal 518 each clock cycle.

Detector 506 (which may also be referred to herein as a "threshold detector 506") observes when a value of count 516 crosses a value of a threshold signal 510 and sets selection signal 522 based on the type of crossing it observes. The value of threshold signal 510 may be set by a circuit that is not shown. In response to observing that the value of count 516 is increasing, detector 506 detects a crossing from below to above the value of threshold signal 510 (a first type of crossing). In response to observing that a value of count 516 is decreasing, detector 506 detects a crossing from above to below the value of threshold signal 510 (a second type of crossing that is different than the first type of crossing). Detector 506 sets selection signal 522 at least partially in response to observing a crossing of the threshold value and the type of crossing it observes.

In one or more examples, values to which detector 506 may set the selection signal 522 are pre-associated with specific inputs of multiplexer 502 and respective ones of step size signals 508 received at respective inputs of multiplexer 502. In one or more examples detector 506 controls selected step size signal 518 via selection signal 522 and multiplexer 502 to be a value sufficient to bypass a range of values of count 516 that are associated with a DCO frequency overlap region, and then in a subsequent clock cycle it controls selected step size signal 518 via selection signal 522 and multiplexer 502 to be a value associated with DCO step size or normal step size.

DCO control code 210 may be based on count 516. In this example, the adjustment signal 214 is the selected step size signal 518 utilized by counter 504 to increment or decrement the value of count 516.

FIG. 6 is a flow diagram depicting a process 600 to bypass DCO frequency overlap regions in a PLL, in accordance with one or more examples. Some or a totality of operations of process 600 may be performed, as a non-limiting example, by integral path portion 200 of FIG. 2, apparatus 300 of FIG. 3, apparatus 400 of FIG. 4, apparatus 500 of FIG. 5, or a PLL including the same.

Although the example process 600 depicts a particular sequence of operations, the sequence may be altered without departing from the scope of the present disclosure. For example, some of the operations depicted may be performed in parallel or in a different sequence that does not materially affect the function of the process 600. In other examples, different components of an example device or system that implements the process 600 may perform functions at substantially the same time or in a specific sequence.

In one or more examples, process 600 includes observing that a DCO frequency is at a boundary of a DCO frequency overlap region at operation 602. In one or more examples, process 600 may include inferring that the DCO frequency is at a boundary of a DCO frequency overlap region in response to observing that a DCO control code has crossed a threshold set at or near a control code associated with the boundary of the DCO frequency overlap region.

In one or more examples, process 600 includes bypassing at least a portion of the DCO frequency overlap region at operation 604. Process 600 may bypass at least the portion of the DCO frequency overlap region in response to observing that the DCO frequency is at a boundary of the DCO frequency overlap region in operation 602.

FIG. 7 is a flow diagram depicting a process 700 to observe that a DCO frequency is at a boundary of a DCO frequency overlap region, in accordance with one or more examples.

Although the example process 700 depicts a particular sequence of operations, the sequence may be altered without departing from the scope of the present disclosure. For example, some of the operations depicted may be performed in parallel or in a different sequence that does not materially affect the function of the process 700. In other examples, different components of an example device or system that implements the process 700 may perform functions at substantially the same time or in a specific sequence.

In one or more examples, process 700 includes receiving a current control code for an integral input of a DCO at operation 702. The current control code may be the bits of an accumulated value being used as a control code output by a digital integrator.

In one or more examples, process 700 includes determining a direction of the current control code at least partially based on a difference between the current control code and a previous control code at operation 704.

In one or more examples, process 700 includes choosing a set of control codes predetermined to correspond to boundaries of DCO frequency overlap regions at least partially based on the determined direction of the current control code at operation 706. In one or more examples, respective control codes of the set may correspond exactly to a boundary or may be some predetermine distance before a boundary to give time to set up the adjustment value. In other words, in some examples, boundary codes may be predetermined to detect approaching boundaries of respective DCO frequency overlap regions.

In one or more examples, process 700 includes comparing the current control code to the chosen set of control codes at operation 708.

In one or more examples, process 700 includes observing that the DCO frequency is at the boundary of the DCO frequency overlap region at least partially responsive to the comparing at operation 710.

In one or more examples, process 700 optionally includes if observed that the current control code corresponds to a boundary of the DCO frequency overlap region, then indicating that the DCO frequency is at a boundary of a DCO frequency overlap region at operation 712.

In one or more examples, process 700 optionally includes if observed that the current control code does not correspond to a boundary of the DCO frequency overlap region, then indicating that the DCO frequency is not at a boundary of a DCO frequency overlap region at operation 714.

FIG. 8 is a flow diagram depicting a process 800 to bypass at least a portion of the DCO frequency overlap region, in accordance with one or more examples. Some or a totality of operations of process 800 may be performed, as non-limiting examples, by integral path portion 200 of FIG. 2 or apparatus 300 of FIG. 3, apparatus 400 of FIG. 4, or apparatus 500 of FIG. 5.

Although the example process 800 depicts a particular sequence of operations, the sequence may be altered without departing from the scope of the present disclosure. For example, some of the operations depicted may be performed in parallel or in a different sequence that does not materially affect the function of the process 800. In other examples, different components of an example device or system that implements the process 800 may perform functions at substantially the same time or in a specific sequence.

In one or more examples, process 800 includes obtaining an adjustment value associated with a control code indicated by a received boundary detection signal at operation 802. The received boundary detection signal is generated in response to observing a boundary of a DCO frequency overlap region, for example, as described with reference to FIG. 7.

In one or more examples, process 800 includes generating an adjustment signal proportional to the adjustment value at operation 804.

In one or more examples, process 800 includes providing the adjustment signal to a digital integrator providing control codes for an integral input of a DCO at operation 806.

FIG. 9 is a flow diagram depicting a process to bypass at least a portion of the DCO frequency overlap region, in accordance with one or more examples.

Although the example process 900 depicts a particular sequence of operations, the sequence may be altered without departing from the scope of the present disclosure. For example, some of the operations depicted may be performed in parallel or in a different sequence that does not materially affect the function of the process 900. In other examples, different components of an example device or system that implements the process 900 may perform functions at substantially the same time or in a specific sequence.

According to one or more examples, process 900 includes incrementing or decrementing a count by a predetermined step size signal at operation 902.

According to one or more examples, process 900 includes observing the count crossing a value of a threshold signal at operation 904.

According to one or more examples, process 900 includes setting the count to a predetermined value at least partially responsive to observing the crossing at operation 906.

FIG. 10 is a flow diagram depicting a process to bypass at least a portion of the DCO frequency overlap region, in accordance with one or more examples.

Although the example routine depicts a particular sequence of operations, the sequence may be altered without departing from the scope of the present disclosure. For example, some of the operations depicted may be performed in parallel or in a different sequence that does not materially affect the function of the routine. In other examples, different components of an example device or system that implements the routine may perform functions at substantially the same time or in a specific sequence.

According to one or more examples, process 1000 includes incrementing or decrementing a count by a step size signal at operation 1002.

According to one or more examples, process 1000 includes observing the count crossing a threshold signal at operation 1004.

According to one or more examples, process 1000 includes setting the step size signal at least partially responsive to observing the crossing at operation 1006. In one or more examples, the step size signal is set to a different, larger value in response to observing the crossing at operation 1006.

Figure 11:
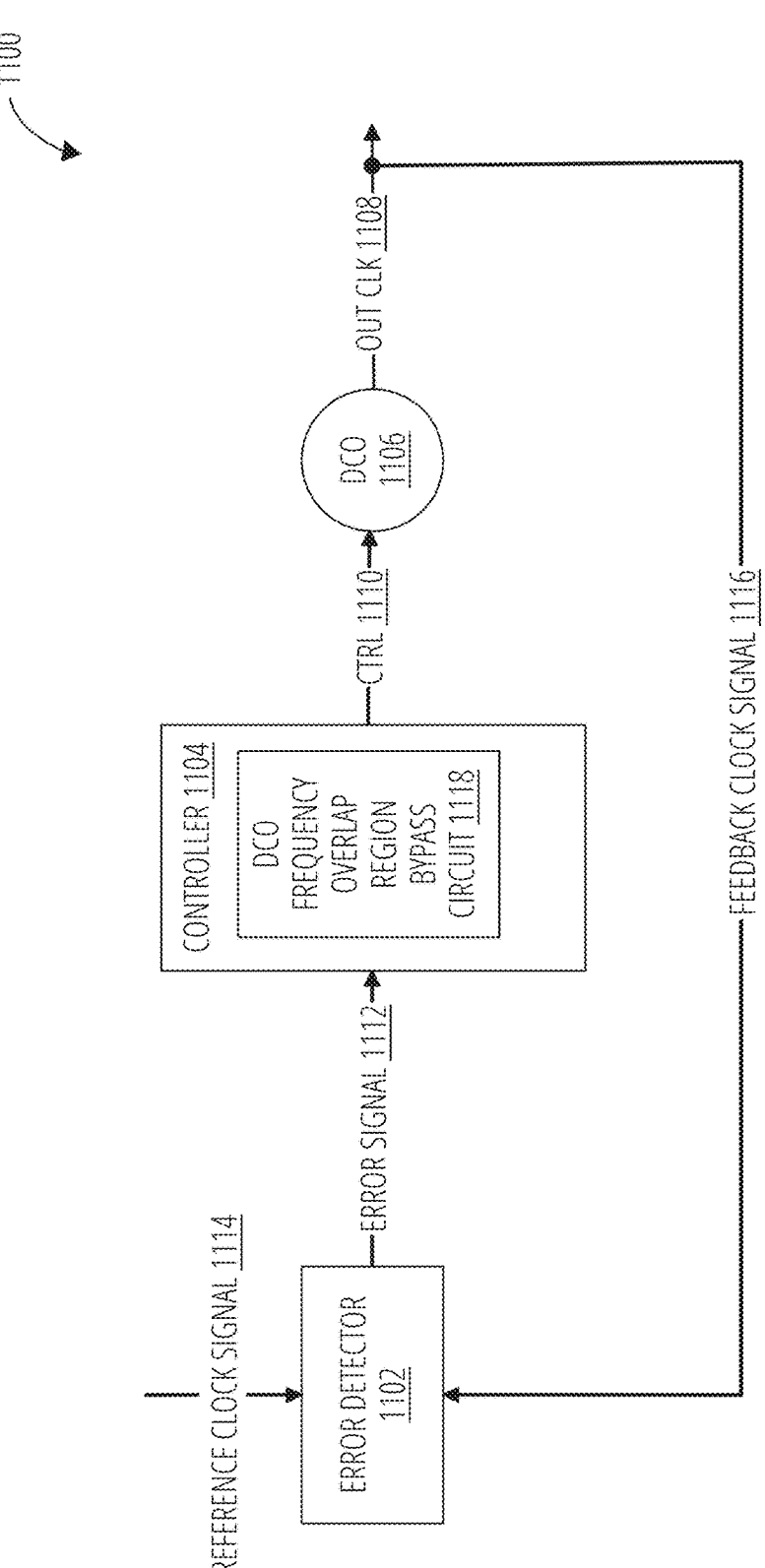
FIG. 11 is a block diagram depicting an apparatus to track a clock (and may also be referred to herein as a "clock tracking circuit"), in accordance with one or more examples.

FIG. 11 is a block diagram depicting an apparatus 1100 to track a clock (and may also be referred to herein as a "clock tracking circuit 1100"), in accordance with one or more examples. In one or more examples, clock tracking circuit 1100 may be a hybrid PLL or digital PLL.

Clock tracking circuit 1100 operates, generally, to generate an output clock signal 1108 phase-locked and frequency-locked to reference clock signal 1114. Clock tracking circuit 1100 includes an error detector 1102, a controller 1104, and a digitally controlled oscillator 1106. Controller 1104 includes DCO frequency overlap region bypass circuit 1118.

Error detector 1102 receives reference clock signal 1114 and feedback clock signal 1116 and generates error signal 1112 at least partially responsive thereto. More specifically, error detector 1102 generates an error signal that is proportional to the phase and frequency difference between the two input signals. More specifically, the magnitude and direction of the error signal are proportional to the phase and frequency difference between the input signals. If the phase and frequency of the two inputs signals is substantially the same, the magnitude and direction of error signal 1112 will be zero, indicating that the phase and frequency of the two signals are the same. If there is a phase or frequency difference between the two input signals is different, the magnitude and direction of error signal 1112 will be non-zero and proportional to the difference between the phase (and indirectly, the frequency) of the two input signals.

In a case where error detector 1102 is a binary phase detector that generates a binary signal, error detector 1102 may generate error signal 1112 as a binary signal having two separate and distinct component signals, an UP signal and a DOWN signal. Error detector 1102 generates the UP signal and the DOWN signal as a series of pulses, where pulses on respective ones of the UP signal and DOWN signal indicate the magnitude and direction of error signal 1112. An UP pulse indicates that the phase or frequency of one of the input signals is leading the other, and a down pulse indicates that the phase or frequency of one of the input signals is lagging the other. The magnitude of error signal 1112 is represented by the number of pulses generated in a given time period in the UP signal or DOWN signal. A larger number of pulses indicating a larger phase or frequency difference between the two input signals, and a smaller number of pulses indicating a smaller phase or frequency difference.

Reference clock signal 1114 may be generated by any suitable clock source for a given operational context. Feedback clock signal 1116 may be the same as output clock signal 1108 generated by clock tracking circuit 1100 (e.g., output clock signal 1108 is provided directly to an input of error detector 1102, without limitation) or may be a clock signal indicative of the phase and frequency of output clock signal 1108. For example, the phase and frequency of feedback clock signal 1116 may be the same or different than output clock signal 1108, but in either case, is relatable back to the phase and frequency of output clock signal 1108. In one or more examples, feedback clock signal 1116 may be a frequency divided version of output clock signal 1108

(e.g., via a frequency divider or buffer, without limitation). In one or more, error detector 1102 may be any suitable error detector for producing a digital signal that represents the phase error between reference clock signal 1114 and feedback clock signal 1116, as a non-limiting example, a bang-bang phase detector, without limitation.

Digitally controlled oscillator 1106 is an electronic oscillator for generating output clock signal 1108 at least partially in response to control signal 1110, which control signal 1110 are a digital control signal or digital control code. The control signal 1110 is fed to an input of digitally controlled oscillator 1106.

Controller 1104 provides control signal 1110 to digitally controlled oscillator 1106 to adjust output clock signal 1108. In one or more examples, controller 1104 may include circuits (analog circuits, digital circuits, or both) to provide a proportional control path and an integral control path for control of digitally controlled oscillator 1106. The integral control path may include an integral path portion 200 that implements DCO frequency overlap region bypass circuit 1118. Because controller 1104 sets control signal 1110 via DCO frequency overlap region bypass circuit 1118, clock tracking circuit 1100 may exhibit reduced DCO frequency overlap-induced limit cycles.

Figure 12:
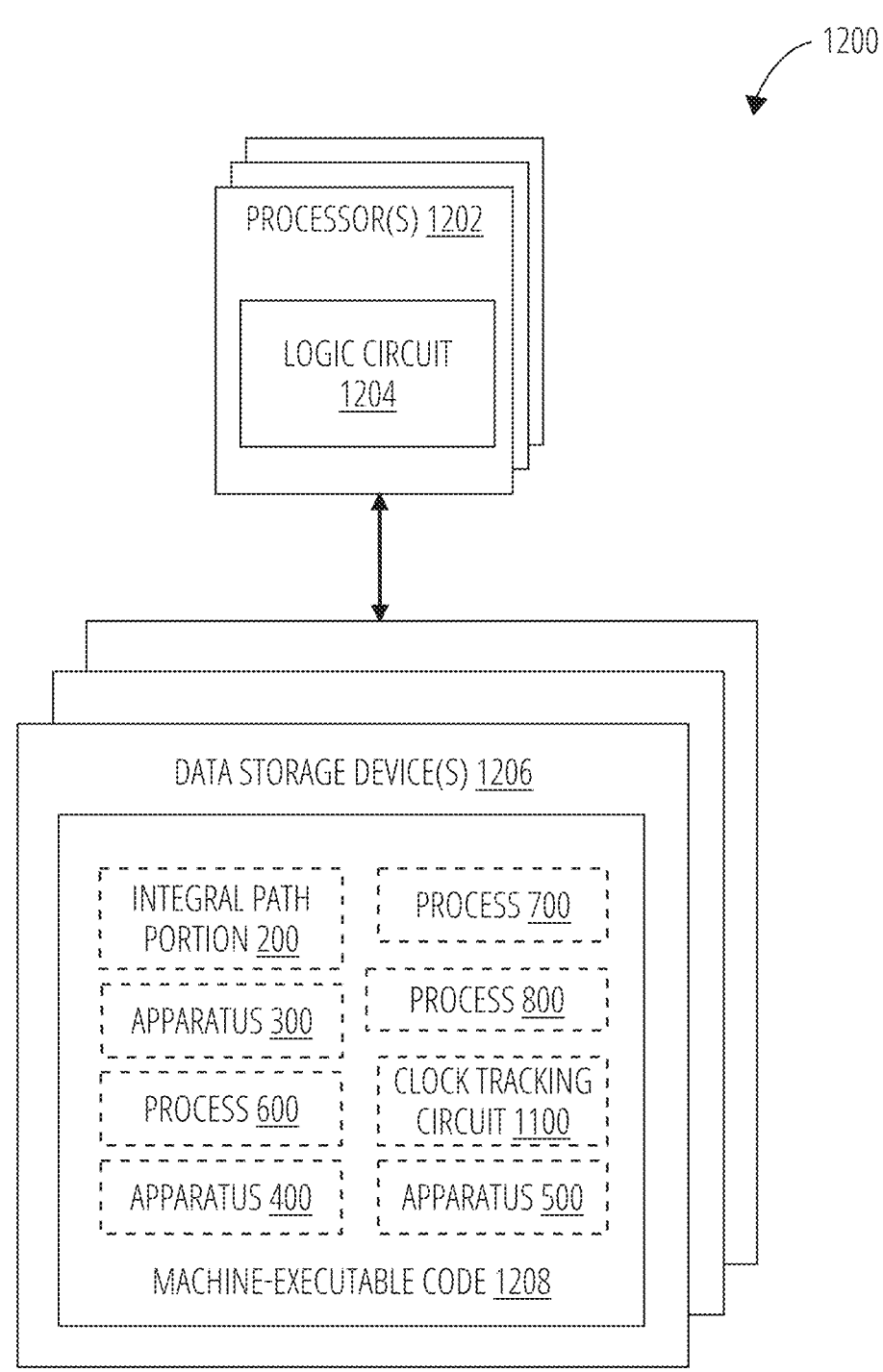
FIG. 12 is a block diagram of a circuit that, in some examples, may be used to implement various functions, operations, acts, processes, or methods disclosed herein.

It will be appreciated by those of ordinary skill in the art that functional elements of examples disclosed herein (e.g., functions, operations, acts, processes, or methods) may be implemented in any suitable hardware, software, firmware, or combinations thereof. FIG. 12 illustrates non-limiting examples of implementations of functional elements disclosed herein. In some examples, some or all portions of the functional elements disclosed herein may be performed by hardware specially for carrying out the functional elements.

It will be appreciated by those of ordinary skill in the art that functional elements of examples disclosed herein (e.g., functions, operations, acts, processes, or methods) may be implemented in any suitable hardware, software, firmware, or combinations thereof. FIG. 12 illustrates non-limiting examples of implementations of functional elements disclosed herein. In some examples, some or all portions of the functional elements disclosed herein may be performed by hardware specially for carrying out the functional elements.

FIG. 12 is a block diagram of an apparatus 1200 (also referred to herein as a "circuit 1200" or "circuitry 1200") that, in some examples, may be used to implement various functions, operations, acts, processes, or methods disclosed herein. The circuit 1200 includes one or more processors 1202 (sometimes referred to herein as "processors 1202") operably coupled to one or more data storage devices 1206 (sometimes referred to herein as "storage 1206"). The storage 1206 includes machine-executable code 1208 stored thereon and the processors 1202 include logic circuit 1204. The machine-executable code 1208 includes information describing functional elements that may be implemented by (e.g., performed by) the logic circuit 1204. The logic circuit 1204 is adapted to implement (e.g., perform) the functional elements described by the machine-executable code 1208. The circuit 1200, when executing the functional elements described by the machine-executable code 1208, should be considered as special purpose hardware for carrying out functional elements disclosed herein. In some examples the processors 1202 may perform the functional elements described by the machine-executable code 1208 sequentially, concurrently (e.g., on one or more different hardware platforms), or in one or more parallel process streams.

When implemented by logic circuit 1204 of the processors 1202, the machine-executable code 1208 adapts the processors 1202 to perform operations of examples disclosed herein. By way of non-limiting example, the machine-executable code 1208 adapts the processors 1202 to perform some or a totality of operations related to reducing DCO frequency overlap induced limit cycles in hybrid and digital PLLs discussed herein. By way of further non-limiting example, machine-executable code 1208 adapts the processors 1202 to perform some or a totality of operations related to one or more of: process 600, process 700, process 800, process 900, or process 1000.

Also, by way of non-limiting example, the machine-executable code 1208 may adapt the processors 1202 to perform some or a totality of features, functions, or operations disclosed herein for one or more of: apparatus 100, apparatus 200, apparatus 300, apparatus 400, apparatus 500, or system 1100.

The processors 1202 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer executes, or is configured to execute, functional elements corresponding to the machine-executable code 1208 (e.g., software code, firmware code, hardware descriptions) related to examples of the present disclosure. It is noted that a general-purpose processor (may also be referred to herein as a host processor or simply a host) may be a microprocessor, but in the alternative, the processors 802 may include any conventional processor, controller, microcontroller, or state machine. The processors 1202 may also be implemented as a combination of computing devices, such as a combination of a DSP and a microprocessor, a plurality of microprocessors, one or more microprocessors in conjunction with a DSP core, or any other such configuration.

In some examples, the storage 1206 includes volatile data storage (e.g., random-access memory (RAM)), non-volatile data storage (e.g., Flash memory, a hard disc drive, a solid-state drive, erasable programmable read-only memory (EPROM), without limitation). In some examples, the processors 1202 and the storage 1206 may be implemented into a single device (e.g., a semiconductor device product, a system on chip (SOC), without limitation). In some examples, the processors 1202 and the storage 1206 may be implemented into separate devices.

In some examples the machine-executable code 1208 may include computer-readable instructions (e.g., software code, firmware code). By way of non-limiting example, the computer-readable instructions may be stored by the storage 1206, accessed directly by the processors 1202, and executed by the processors 1202 using at least the logic circuit 1204. Also, by way of non-limiting example, the computer-readable instructions may be stored on the storage 1206, transferred to a memory device (not shown) for execution, and executed by the processors 802 using at least the logic circuit 1204. Accordingly, in some examples the logic circuit 1204 includes electrically configurable logic circuit 1204.

In some examples the machine-executable code 1208 may describe hardware (e.g., circuitry) to be implemented in the logic circuit 1204 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG®, SYS-TEMVERILOG™ or very large-scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuit 1204 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine-executable code 1208 may include an HDL, an RTL, a GL description, a mask level description, other hardware description, or any combination thereof.

In examples where the machine-executable code 1208 includes a hardware description (at any level of abstraction), a system (not shown, but including the storage 1206) may implement the hardware description described by the machine-executable code 1208. By way of non-limiting example, the processors 1202 may include a programmable logic device (e.g., an FPGA or a PLC) and the logic circuit 1204 may be electrically controlled to implement circuitry corresponding to the hardware description into the logic circuit 1204. Also, by way of non-limiting example, the logic circuit 1204 may include hard-wired logic manufactured by a manufacturing system (not shown but including the storage 1206) according to the hardware description of the machine-executable code 1208.

Regardless of whether the machine-executable code 1208 includes computer-readable instructions or a hardware description, the logic circuit 1204 is adapted to perform the functional elements described by the machine-executable code 1208 when implementing the functional elements of the machine-executable code 1208. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations that perform the actions of the module or component and/or software objects or software routines that may be stored on and/or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means "some or a totality." As used herein, the term "each and every" means a "totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples include:

Example 1: An apparatus comprising: a digital integrator to generate a frequency error signal at least partially based on a digital phase error signal; and a logic circuit to set an integrated value of the digital phase error signal stored at a register of the digital integrator.

Example 2: The apparatus according to Example 1, wherein to set the integrated value of the digital phase error signal stored at the register of the digital integrator, the logic circuit to: adjust a gain of the digital integrator.

Example 3: The apparatus according to any of Examples 1 and 2, wherein to adjust the gain of the digital integrator, the logic circuit to: set a parameter that controls integration of the digital phase error signal at the digital integrator.

Example 4: The apparatus according to any of Examples 1 through 3, wherein the parameter comprises: an accumulation step size, an accumulation time, or a scaling factor.

Example 5: The apparatus according to any of Examples 1 through 4, wherein the logic circuit comprises: a boundary detector; and a look-up-table (LUT) responsive to the boundary detector, wherein the LUT associates adjustment values with boundary codes.

Example 6: The apparatus according to any of Examples 1 through 5, wherein the logic circuit to set the integrated value is at least partially based on a respective adjustment value.

Example 7: The apparatus according to any of Examples 1 through 6, wherein the digital integrator includes a counter to increment and decrement a count, and wherein the logic circuit includes a threshold detector to set the counter to a predetermined value at least partially responsive to the count and a threshold value.

Example 8: The apparatus according to any of Examples 1 through 7, wherein the logic circuit includes a detector to set a selection signal responsive to a count and a threshold value, and a multiplexer to receive step size signals and output a selected step size signal responsive to the selection signal, and wherein the digital integrator includes a counter to increment or decrement the count by an amount corresponding to the selected step size signal.

Example 9: A method comprising: observing that a DCO frequency is at a boundary of a DCO frequency overlap region; and bypassing at least a portion of the DCO frequency overlap region.

Example 10: The method according to Example 9, wherein the observing that the DCO frequency is at the boundary of the DCO frequency overlap region comprises: receiving a current control code for an integral input of a DCO; determining a direction of the current control code at least partially based on a difference between the current control code and a previous control code; comparing the current control code to a set of control codes; and observing that the DCO frequency is at the boundary of the DCO frequency overlap region at least partially responsive to the comparing.

Example 11: The method according to any of Examples 9 and 10, comprising: indicating that the DCO frequency is at the boundary of the DCO frequency overlap region responsive to observing that the current control code corresponds to the boundary of the DCO frequency overlap region.

Example 12: The method according to any of Examples 9 through 11, comprising: indicating that the DCO frequency is not at the boundary of the DCO frequency overlap region responsive to observing that the current control code does not correspond to the boundary of the DCO frequency overlap region.

Example 13: The method according to any of Examples 9 through 12, comprising: choosing a set of control codes predetermined to correspond to boundaries of DCO frequency overlap regions at least partially based on the determined direction of the current control code.

Example 14: The method according to any of Examples 9 through 13, wherein the bypassing at least a portion of the DCO frequency overlap region comprises: obtaining an adjustment value associated with a control code identified by a boundary detection signal; generating an adjustment signal proportional to the adjustment value; and providing the adjustment signal to a digital integrator providing control codes for an integral input of a DCO.

Example 15: The method according to any of Examples 9 through 14, comprising: incrementing or decrementing a count by a predetermined step size signal; observing the count is at a value of a threshold signal; and setting the count to a predetermined value at least partially responsive to observing the crossing.

Example 16: The method according to any of Examples 9 through 15, comprising: incrementing or decrementing a count by a step size signal; observing the count crossing a threshold signal; and setting the step size signal to a larger value at least partially responsive to observing the count crossing the threshold signal.

Example 17: An apparatus, comprising: a digitally controlled oscillator (DCO) of a hybrid or digital clock tracking circuit, the DCO including an input for integral control of the DCO; and a controller to generate a control code for the input for integral control of the digitally controlled oscillator, wherein the controller utilizes control codes to reduce DCO frequency overlap-induced limit cycles.

Example 18: The apparatus according to Example 17, comprising: an error detector to generate an error signal that represents a difference between an output of the DCO and a reference signal, wherein the controller to generate the control code to reduce the difference is represented by the error detector.

Example 19: The apparatus according to any of Examples 17 and 18, wherein the controller sets the value of the control code to bypass a DCO frequency overlap region of the DCO.

Example 20: The apparatus according to any of Examples 17 through 19, wherein the controller sets bypass values of the control code that correspond to DCO frequencies within a DCO frequency overlap region.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. A method comprising:
observing digitally controlled oscillator (DCO) control codes to determine when a DCO control code being utilized to set a DCO frequency matches a DCO control code value associated with a boundary of a DCO frequency overlap region having a corresponding value or a corresponding range of values of the DCO control code; and
bypassing one or more DCO control code values associated with a portion of the DCO frequency overlap region by jumping at least some of the one or more DCO control code values.

2. The method of claim 1, wherein the observing that the DCO frequency is at the boundary of the DCO frequency overlap region comprises:
receiving a current control code for an integral input of a DCO;

determining a direction of the current control code at least partially based on a difference between the current control code and a previous control code;

comparing the current control code to a set of control codes; and observing that the DCO frequency is at the boundary of the DCO frequency overlap region at least partially responsive to the comparing.

3. The method of claim 2, comprising:

indicating that the DCO frequency is at the boundary of the DCO frequency overlap region responsive to observing that the current control code corresponds to the boundary of the DCO frequency overlap region.

4. The method of claim 2, comprising:

indicating that the DCO frequency is not at the boundary of the DCO frequency overlap region responsive to observing that the current control code does not correspond to the boundary of the DCO frequency overlap region.

5. The method of claim 2, comprising:

choosing a set of control codes predetermined to correspond to boundaries of DCO frequency overlap regions at least partially based on the determined direction of the current control code.

6. The method of claim 1, wherein the bypassing at least a portion of the DCO frequency overlap region comprises:

obtaining an adjustment value associated with a control code identified by a boundary detection signal;

generating an adjustment signal proportional to the adjustment value; and providing the adjustment signal to a digital integrator providing control codes for an integral input of a DCO.

7. The method of claim 1, comprising:

incrementing or decrementing a count by a predetermined step size signal;

observing the count is at a value of a threshold signal; and setting the count to a predetermined value at least partially responsive to observing the count.

8. The method of claim 1, comprising:

incrementing or decrementing a count by a step size signal;

observing the count crossing a threshold signal; and setting the step size signal to a larger value at least partially responsive to observing the count crossing the threshold signal.

9. The method of claim 1, comprising:

setting an integrated value, in that the DCO control code is based on the integrated value, to bypass at least a portion of the DCO frequency overlap region;

responsive to a phase locked loop (PLL) including a DCO increasing or decreasing the DCO frequency, monotonically increasing or decreasing the integrated value accordingly; and increasing, decreasing, or directly setting the integrated value to a new value by an adjustment amount.

10. The method of claim 9, comprising:

responsive to determining reduction in DCO frequency overlap-induced at least one of limit cycle and jitter in the PLL, causing a decrease in effects of frequency redundancy in the DCO.

11. A clock tracking circuit comprising:

a phase locked loop (PLL) to generate an output signal from a reference signal in response to a digital phase error signal and generate digital control oscillator (DCO) codes;

a DCO included in the PLL to generate the output signal based on a value of a DCO code;

a circuit to generate an adjustment signal based on the DCO codes for changing a current value of the DCO code to a new value responsive to determining that a value of the DCO code being associated with a boundary of a DCO frequency overlap region; and a controller coupled to the DCO to receive a control signal and generate the output signal, wherein the controller, for reducing effects of frequency redundancy, to:

observe that a DCO frequency is at the boundary of the DCO frequency overlap region by observing the DCO code to determine when a DCO code being utilized to set a DCO frequency matches a DCO code value associated with a boundary of a DCO frequency overlap region having a corresponding value or a corresponding range of values of the DCO code, and bypass at least a portion of the DCO frequency overlap region by bypassing one or more DCO code values associated with a portion of the DCO frequency overlap region by jumping at least some of the one or more DCO code values.

12. The clock tracking circuit of claim 11, wherein to observe that the DCO frequency is at the boundary of the DCO frequency overlap region, the controller to:

receive a current control code for an integral input of the DCO;

determine a direction of the current control code at least partially based on a difference between the current control code and a previous control code;

compare the current control code to a set of control codes; and observe that the DCO frequency is at the boundary of the DCO frequency overlap region at least partially responsive to the comparing.

13. The clock tracking circuit of claim 12, wherein the controller to:

indicate that the DCO frequency is at the boundary of the DCO frequency overlap region responsive to observing that the current control code corresponds to the boundary of the DCO frequency overlap region.

14. The clock tracking circuit of claim 12, wherein the controller to:

indicate that the DCO frequency is not at the boundary of the DCO frequency overlap region responsive to observing that the current control code does not correspond to the boundary of the DCO frequency overlap region.

15. The clock tracking circuit of claim 12, wherein the controller to:

choose a set of control codes predetermined to correspond to boundaries of DCO frequency overlap regions at least partially based on the determined direction of the current control code.

16. The clock tracking circuit of claim 11, wherein to bypass at least a portion of the DCO frequency overlap region, the controller to:

obtain an adjustment value associated with a control code identified by a boundary detection signal;

generate the adjustment signal proportional to the adjustment value; and provide the adjustment signal to a digital integrator providing control codes for an integral input of a DCO.

17. The clock tracking circuit of claim 11, wherein the controller to:

increment or decrementing a count by a predetermined step size signal;

observe the count is at a value of a threshold signal; and set the count to a predetermined value at least partially responsive to observing the count.

18. The clock tracking circuit of claim 11, the controller to:

increment or decrement a count by a step size signal;

observe the count crossing a threshold signal; and set the step size signal to a larger value at least partially responsive to observing the count crossing the threshold signal.

\* \* \* \* \*